United States Patent [19]

Harthcock

[11] Patent Number: 5,235,268

[45] Date of Patent: Aug. 10, 1993

[54] TEST AND MEASUREMENT SYSTEM

[76] Inventor: Jerry D. Harthcock, 1301 N. Denton Dr., Carrollton, Tex. 75006

[21] Appl. No.: 791,454

[22] Filed: Nov. 13, 1991

[51] Int. Cl.$^5$ .................... G01R 31/02; G01R 13/20
[52] U.S. Cl. .................... 324/115; 324/72.5; 324/158 P; 324/121 R
[58] Field of Search .................... 324/72.5, 150 P, 149, 324/121 R, 115; 364/487; 340/706–708, 712; 178/18

[56] References Cited

U.S. PATENT DOCUMENTS

| | | | |
|---|---|---|---|
| 3,829,776 | 8/1974 | Lozoya | 324/149 |
| 4,114,095 | 9/1978 | Pankove et al. | 324/149 |
| 4,298,837 | 11/1981 | Koslar | 324/72.5 |
| 4,574,278 | 3/1986 | Apelman | 324/121 R |
| 4,667,182 | 5/1987 | Murphy | 178/18 |
| 4,743,839 | 5/1988 | Rush | 324/121 R |
| 4,758,779 | 7/1988 | Thong | 324/72.5 |
| 4,786,764 | 11/1988 | Padula et al. | 178/18 |
| 4,843,538 | 6/1989 | Lane et al. | 340/706 |
| 4,959,511 | 9/1990 | Lloyd et al. | 178/18 |
| 4,975,689 | 12/1990 | Suzuki et al. | 324/121 R |
| 5,004,871 | 4/1991 | Purcell | 178/18 |
| 5,061,828 | 10/1991 | Purcell | 178/18 |
| 5,111,004 | 5/1992 | Gullman | 178/18 |

*Primary Examiner*—Vinh Nguyen
*Attorney, Agent, or Firm*—Johnson & Gibbs

[57] ABSTRACT

A system for simultaneously probing an electrical test circuit while remotely controlling the test equipment used to measure the probing. The probing is performed by the use of an electrical test probe of the type utilized with oscilloscopes or the like. Incorporated within the probe are switches adapted to detecting both lateral and longitudinal pressures exerted by the probe user. The lateral pressure is applied to the lower portion of the probe and depending upon the direction of the pressure causes a cursor displayed on the test equipment to move. The user moves the displayed cursor to the desired position, which position corresponds to a function or option of the test instrument. Upon selection, the user exerts a longitudinal force upon the probe, which force is detected by the probe and activates the selected function or option on the test instrument.

13 Claims, 3 Drawing Sheets

TEST AND MEASUREMENT SYSTEM

BACKGROUND OF THE INVENTION

1. Field of the Invention

The invention relates to automated test and measurement instruments which utilize a microprocessor controlled user interface, and more particularly to a system for simultaneously probing a circuit while remotely controlling test and measurement instrumentation used for the probing.

2. Description of the Prior Art

Automated test and measurement instruments such as digital storage oscilloscopes utilize a digital display for portraying digitized waveforms, test parameters, settings, and cursory readouts. The display achieved corresponds to an input signal as well as to certain user interactions to the test and measurement instrument. For example, a person working with a test instrument may depress certain control keys provided for the instrument in order to achieve a specific result, such as movement of a cursor or the adjustment of a calibration or measurement gradient. In oscilloscopes, for instance, a specific measurement may require the user to change the time base or magnification setting; these changes require manipulation of the controls on the oscilloscope as well as those exhibited on the instrument's display.

The development of control switches for test and measurement instrumentation has traditionally followed a single path. As those skilled in the art are aware, historically, the control switches for a device resided on the face of the measurement device. The user was forced, when he or she desired to manipulate the control settings, to stop the actual act of measuring or testing and make the required adjustments. In many cases these adjustments demanded the user to remove the measuring probe from the tested circuit because the user's hands were required for the test instrument control switch manipulation. Removal of the test probe often slowed down the test process as it may take considerable time to repeatedly locate the proper test point and make a proper electrical contact. Thus, whenever the test probe had to be removed the test process was slowed. Consequently, the prior art control switches located on the face of the test and measuring equipment create significant obstacles to the efficient, accurate and rapid testing of devices.

Recently, prior art test and measurement instruments have incorporated more "user friendly" interface and control technology. These more advanced prior art interfaces employ less, and some times no, hardware buttons on the front of the instrument. Instead of hardware buttons and switches, these prior art devices utilize multiple "soft buttons." The "soft buttons" are graphically drawn on the instrument's display. Because they are not "hard wired" buttons, the user does not necessarily have to physically manipulate the button. Instead, they may be controlled and activated by a pointing means such an arrow key, knob, or a mouse. Once selected, the function associated with the selected "soft button" becomes activated. In many instances, activating one soft button function could result in a number of other soft button options associated with the first button to become active. Thus, a series of selections may be effectuated through the initiation of a single "soft button."

While the newer "soft buttons" provide additional flexibility, they continue to have their drawbacks. For example, one major problem with these new test and measuring instruments continues to be that they require the user to free at least one hand to make the desired adjustments, even by way of a mouse. Consequently, the user has no way to change settings or make arbitrary cursor adjustments without the use of a free hand while probing a circuit. As it is often desirable to make the changes and adjustments simultaneously while probing a test point on a circuit, a free hand may not be readily available. It is very frustrating and time consuming to release the test probe from the test point so that settings and cursor measurements can be made. This problem arises resoundingly when probing VLSI chips having one hundred or more pins.

Consequently, there is a need for a probe that incorporates control capabilities over the measurement and test instrumentation being employed. While a number of buttons or cursor keys could be implemented along a probe's grip, the use of such buttons would demand a very dexterous finger to press the correct button for the desired function. Additionally, the user may sever his or her test point as he or she attempts to manipulate the control buttons located on the probe. Thus, a need exists for a test probe and system which can adjust and manipulate the calibration and measurement settings of a test instrument, while the probe is in use. The test probe should be operable without the use of buttons or cursor keys so that the user need not release or change his or her grip on the probe.

SUMMARY OF THE INVENTION

In one embodiment, the invention relates to a system for simultaneously probing a test point while remotely controlling the calibration of such testing. The system utilizes a test instrument which is adapted to receive a remote probe. The probe houses means for manipulating the functions of the test instrument. The means for manipulating the function of the test instrument comprise means for detecting lateral forces applied to the probe and means for detecting longitudinal forces applied to the probe.

In one aspect of the invention, the test probe includes a tip constructed from hardened, electrically conductive material. The tip is connected to a signal conductor by way of a characteristic impedance circuit. The signal conductor is enveloped by a signal conductor sheath which filters out noise and other potentially distorting signals. An adjustable compensation circuit board is electrically connected to the signal conductor. Further, means for grounding the probe are also electrically connected to the compensation circuit board. Finally, means for transmitting electrical signals from the compensation circuit board to the test instrument are provided.

According to another aspect thereof, the invention provides to a method for simultaneously examining a test circuit while adjusting or manipulating the controls of a test instrument. The method includes the step of probing a test circuit with an electrical test probe. When adjustments to the test instrument are desired the probe user exerts a lateral force upon the probe. The lateral force responsively moves a cursor displayed on the test instrument. Movement of the cursor permits the user to remotely choose a function or option on the test instrument. When the user releases the lateral force, the cursor stops moving and the desired function or option is chosen. Finally, the chosen function or option is activated by applying a longitudinal force to the test probe.

DESCRIPTION OF THE PREFERRED EMBODIMENT

Figure 1:
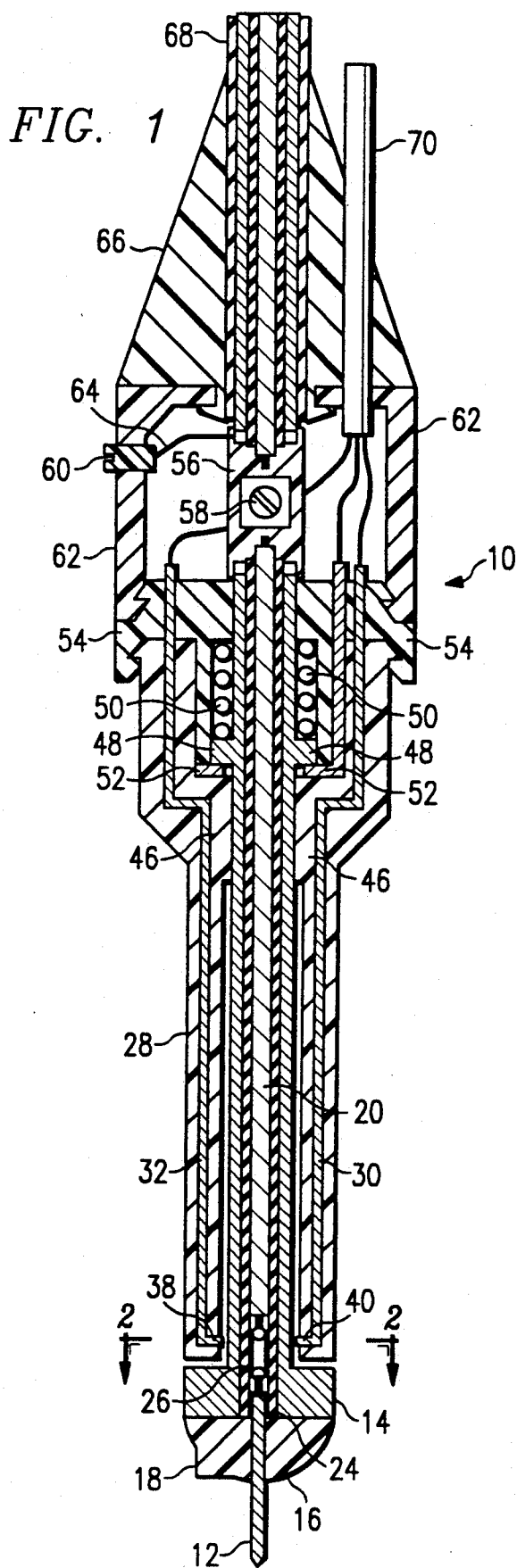
FIG. 1 is a vertical cross-sectional of the probe illustrating the principles of the present invention.

Referring first to FIG. 1, there is shown a cross-sectional diagram of a probe 10 constructed in accordance with principles of the present invention. A probe tip 12 protrudes from the lower end of the probe 10 and is constructed from a relatively hard and electrically conductive material. In the preferred embodiment, it is important that the tip 12 be fabricated from a relatively hard material because during use pressure is applied to the tip 12 such that an indentation in the surface of the tested material is created. Further, in order to facilitate the electrical testing and measuring accurately and without distortion, the tip 12 demands construction from an electrically conductive material. The tip 12 is held firmly in place by a probe tip retaining bulb 16. The probe tip retaining bulb 16 is constructed from a non-electrically conductive material and can be used as a grasping point for the user. An alignment guide 18 protrudes from one side of the retaining bulb 16 and allows the user to properly orient the probe 10 within his or her hands. In the preferred embodiment, it is contemplated that the user will feel the alignment guide 18 with his or her forefinger and thus be able to properly orient the probe 10 so that the predetermined x-axis and y-axis of the probe 10 are correctly positioned.

The probe tip retaining bulb 16 is disposed proximate to a inner probe stem 14. The inner probe stem 14 defines a conduit within which a probe signal conductor sheath 20 is housed. The probe signal conductor sheath 20 provides insulation for a probe signal conductor 22 (shown in FIG. 2). Additionally, the sheath 20 comprises material which helps to maintain signal integrity and clarity by eliminating noise and ambient interference hazardous to signal transmission accuracy. To further eliminate noise and interference, an inner probe stem insulator 24 is provided. The inner probe stem insulator 24 is disposed between the probe signal conductor sheath 20 and the inner probe stem 14. Since the inner probe stem 14 is constructed from an electrically conductive material and carries electrical signals, it is necessary to further insulate the probe signal conductor 22 to assure signal integrity. As can be seen from FIG. 1, the inner probe stem insulator 24 runs the entire length of the conduit defined by the inner probe stem 14. The inner probe stem insulator 24 also insulates a characteristic impedance circuit 26 which electrically connects the probe tip 12 to the probe signal conductor 22. As will be appreciated by those skilled in the art, the characteristic impedance circuit 26 is designed based upon the input and load impedances of the probe 10.

Still referring to FIG. 1, an outer probe housing 28 is constructed from a non-electrically conductive material. In the preferred embodiment, the probe housing 28 may be constructed from plastic or the like such that a durable and electrically neutral container is created for the internal electrical components of the probe 10. Disposed immediately within the probe housing 28 are conductors 30, 32, 34 and 36 (conductors 34 and 36 not being shown) which carry electrical signals created when the inner probe stem 14 contacts with either the −x axis conductive pad 38, the +x axis conductive pad 40, the −y axis conductive pad 42 and/or the +y axis conductive pad 44 (pads 42 and 44 are more fully shown in FIG. 2). Separating the conductors 30, 32, 34 and 36 from the inner probe stem 14 is the inner probe stem retainer 46. Additionally, an inner probe stem retainer 46 applies pressure to the inner probe stem 14 and holds the probe stem 14 in place. The probe stem 14, being fixed at one end by the probe stem retainer 46 and being free floating at its other end, possesses some flexibility. The flexibility designed into the probe stem 14 permits it to move based upon the actions of the probe user. Thus, when a lateral force is applied to the outer probe housing 28, the probe stem 14 will flex and be forced into contact with one of the conductive pads 38, 40, 42 or 44 (see FIG. 2 also), depending upon the direction of the force.

Still referring to FIG. 1, a probe stem flange 48 is seen protruding from the inner probe stem 14. The probe stem flange 48 is integral with the inner probe stem 14 and is also constructed from an electrically conductive material. The probe stem flange 48 is normally in contact with a selection contactor pad 52. The force maintaining the contact between the probe stem flange 48 and the selection contactor pad 52 is created by a spring 50. The spring 50 is disposed between the probe stem flange 48 and a spring retaining cap 54. The spring retaining cap 54 is constructed from a non-electrically conductive material and, in addition to retaining the spring 50, provides insulation for certain ones of the internal electrically conductive elements of the probe 10. When idle, the spring 50 is in a semi-tensed state; thus, the spring 50 applies pressure to the probe stem flange 48 but can also be further compressed when the user desires to separate the probe stem flange 48 from the selection contactor pad 52. While the inner probe stem retainer 46 holds the inner probe stem 14 in place, it does not restrict the inner probe stem 14 from sliding in a vertical direction with respect to the probe stem retainer 46. Therefore, when the user applies a downward force on the probe 10, which downward force is sufficient to further compress the spring 50, the inner probe stem 14 will slide along the inner probe stem retainer 46 and the probe stem flange 48 and the selection contactor pad 52 will separate, thereby opening the otherwise closed circuit. When the user releases the pressure, the inner probe stem 14 will slide back down along the inner probe stem retainer 46 and the probe stem flange 48 and the selection contactor pad 52 will reunite.

The probe signal conductor 22 (See FIG. 2) makes electrical contact with the flexible cable transition and compensation circuit board 56. The compensation circuit board 56 may be calibrated by way of the adjustable compensation circuit board 58. The compensation circuit board 56 and the adjustable compensation circuit board 58 permit the user to tune the probe according to the test or measurement being conducted or the test instrumentation being employed. A probe ground reference connector 60 is embedded within the wall of a coaxial cable transition housing 62. The probe ground reference connector permits the probe 10 to be grounded to an exterior ground. The ground reference connector 60 is in electrical communication with the compensation circuit board 56 by way of electrical conductor 64.

Emerging from the probe 10 are a coaxial cable 68 and a pointing interface cable 70. The coaxial cable 68 carries the test signals from the probe 10 to the actual test and measurement instrument. A coaxial cable strain relief 66 protects the coaxial cable 68 from being pulled from the probe 10. The pointing interface cable 70 carries the control signals for the selection and manipulation of the test and measurement instrument.

Figure 2:
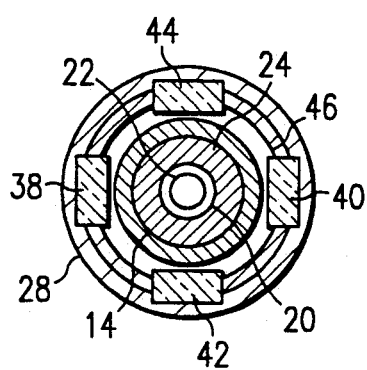
FIG. 2 is a cross-sectional view through the probe, taken along the line 2—2 of FIG. 1, illustrating a four pole, single throw "hula switch" portion of the probe.

Referring next to FIG. 2, there is shown a cross-sectional view of the probe 10 looking into the barrel created by the inner probe stem retainer 46. FIG. 2 illustrates how flexure of the inner probe stem 14 and the resultant contact with any one of the conductive pads 38, 40, 42 or 44 create a single throw "hula-switch." The exterior ring is the outer probe housing 28. Disposed immediately within the outer probe housing 28, on FIG. 2, is the probe stem retainer 46. The −x axis conductive pad 38, the +x axis conductive pad 40, the −y axis conductive pad 42 and the +y axis conductive pad 44 are all held in place by the probe stem retainer 46. The electrically conductive inner probe stem 14 is next seen and is disposed immediately without the inner probe stem insulator 24. Next, the probe signal conductor sheath 20 is disposed between the inner probe stem insulator 24 and the probe signal conductor 22.

From the perspective of FIG. 2, the manner in which the user manipulates and calibrates the test and measurement instrument becomes more apparent. The lower end of the inner probe stem 14 floats within the barrel created by the inner probe stem retainer 46. The inner probe stem 14 being fixed at its upper end by the inner probe stem retainer 46 and being free floating at its lower end is able to flex when a lateral force is applied to the outer probe housing 28. The flex causes the inner probe stem 14 to make contact with either the −x axis conductive pad 38, the +x axis conductive pad 40, the −y axis conductive pad 42 or the +y axis conductive pad 44, depending upon the direction of the lateral force. When the inner probe stem 14 contacts any one of the conductive pads 38, 40, 42 or 44 an electrical circuit is closed. Closure of the electrical circuit transmits a signal to the test or measurement instrument via a wire contained within the pointing interface cable 70. Once the user is satisfied with the change made to the test or measurement instrument, he or she will stop applying the lateral force to the inner probe stem 14, and the inner probe stem 14 will rebound to its idle, non-conducting central position.

Figure 3:
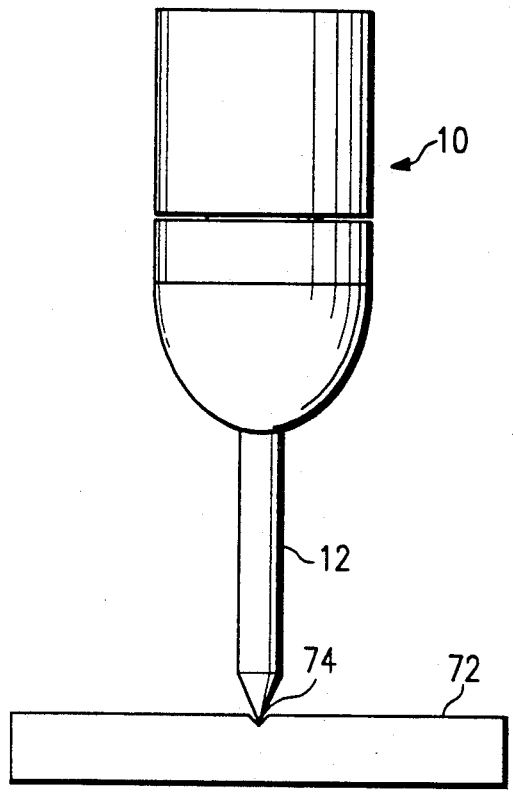
FIG. 3 is a side elevational view of a lower end portion of the probe illustrating how it creates a pivot point during use.

Referring next to FIG. 3, there is seen the lower end of the probe 10 with the tip 12 contacting a test surface 72. As the user applies downward pressure on the probe 10 to the test surface 72, in order to make a proper electrical connection, the probe tip 12 creates an indentation 74. The indentation 74 operates to keep the probe tip 12 in place when the user exerts a lateral force to the probe stem 14 in order to make changes on the test and measurement instrument.

Referring to FIGS. 1, 2 and 3 collectively, the operation of the probe 10 becomes apparent. The user begins use of the probe 10 by placing the probe tip 12 on the test surface 72. The user bears down upon the probe 10 to create an indentation 74. The probe tip 12, being lodged within the indentation 74 is able to pivot without sliding across the test surface 72. When the user desires to change the settings on the test or measurement instrument, a generally lateral force is applied to the outer probe housing 28. The pressure applied to the outer probe housing 28 causes the inner probe stem 14 to flex. The flexure of the inner probe stem 14 prompts one of the conductive pads 38, 40, 42 or 44 to make contact with the inner probe stem 14. The contact between one of the conductive pads 38, 40, 42 or 44 closes an electrical circuit which initiates a change in the test and measurement instrument. The inner probe stem 14 will rebound to its center position when the lateral force is removed. The rebound of the inner probe stem 14 causes the electrical circuit to open. It should be appreciated by those skilled in the art that in place of the mechanical switching previously described, piezo electric sensors may be used to detect the occurrence and direction of the selected lateral force.

While the lateral force is being applied to the outer probe housing 28 and contact is being made between the inner probe stem 14 and one of the conductive pads 38, 40, 42 or 44, the manipulation of the test and measurement instrument continues. Thus, a cursor, or the like, on the test and measurement instrument continues to move among the available selections while the electrical circuit formed between the inner probe stem 14 and the conductive pads 38, 40, 42 or 44 is closed. The direction of the cursor depends upon the conductive pad contacted. Each of the conductive pads, the −x axis conductive pad 38, the +x axis conductive pad 40, the −y axis conductive pad 42 or the +y axis conductive pad 44, causes the cursor to travel in a different direction. By using the alignment guide 18 located on the probe tip retaining bulb 16 the user is able properly orient probe in his or her hands so that the lateral force applied to the outer probe housing 28 is exerted in the appropriate direction.

When the lateral force is removed, the cursor displayed on the test and measurement instrument will stop moving. The selection operation, however, is not complete. With the cursor stopped, the user must activate the selection made with the cursor. The activation occurs when the electrical circuit created by the probe stem flange 48 and the selection contactor pad 52 is open. The probe user opens the circuit by generating a downward axial force on the outer probe housing 28. When idle, the spring 50 provides continuous pressure on the probe stem flange 48, thereby forcing it to contact the contactor pad 52. The inner probe stem 14 and the inner probe stem retainer 46 are in slidable contact with one another. Consequently, a downward longitudinal pressure discharged upon the outer probe housing 28 will cause the inner probe stem retainer 46 to move downward, while the inner probe stem 14 slides along the inner probe stem retainer 46. The spring 50 will contract further during the sliding process. The separation of the probe stem flange 48 and the selection contactor pad 52 opens a normally closed circuit. The open circuit relays a signal to the test and measurement instrument to activate the operation selected with the cursor. Removal of the downward force on housing 28 permits the probe stem flange 48 and the selection contactor pad 52 to reunite, thereby ending the procedure. It should be appreciated by those skilled in the art that in place of the mechanical switching previously described, piezo electric sensors may be used to detect the downward longitudinal force applied on the outer probe housing 28.

Figure 4:
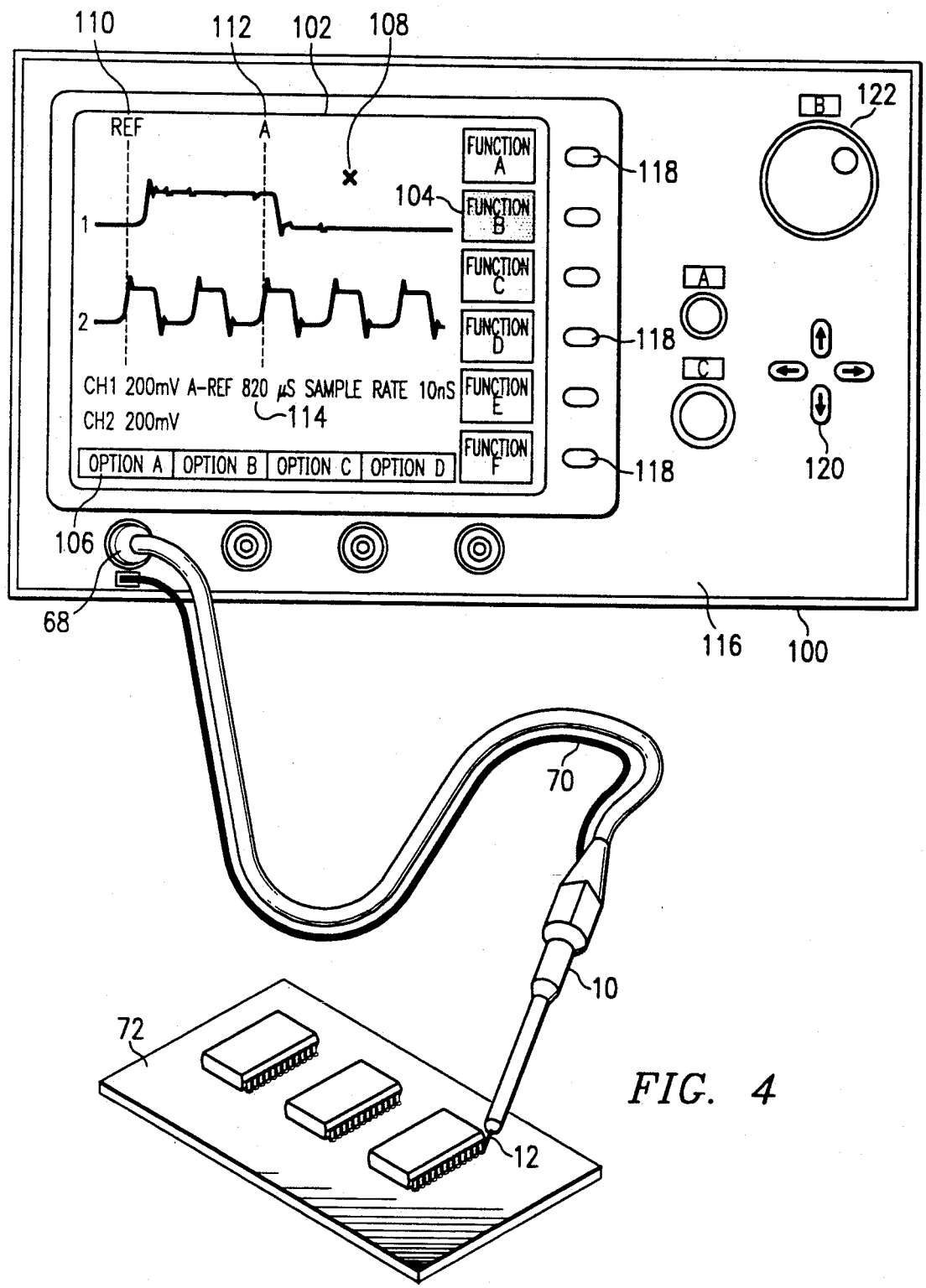
FIG. 4 illustrates the contemplated arrangement of the point-and-probe apparatus with respect to an automated test and measurement instrument.

Referring now to FIG. 4, there is shown a test and measurement instrument 100 connected to a probe 10. The probe 10 is connected to the test and measurement instrument 100 via the coaxial cable 68 and the pointing interface cable 70. The probe tip 12 is shown in contact with a test surface 72.

The test and measurement instrument 100 is equipped with a graphics oriented display 102. The graphics oriented display 102 includes several soft functions 104 and several soft options 106. FIG. 4 illustrates one of the soft functions 104 being selected. The selection of either a soft function 104 or a soft option 106 occurs by use of the probe 10 through the process more fully described in the explanation of FIGS. 1, 2 and 3. Thus, if the user causes the inner probe stem 14 to contact one of the conductive pads 38, 40, 42 or 44 the screen pointer 108 moves in the appropriate direction. For example, if the −y axis conductive pad 42 is contacted, the screen pointer 108 will move downward, which downward movement continues until the user terminates the contact. The user continues movement of the screen pointer until the pointer rests atop the desired soft function 104 or soft option 106. When the screen pointer 108 is on top of a desired soft function 104 or soft option 106, the user exerts a generally longitudinal pressure to the probe 10, which pressure is maintained until the selected soft function 104 or soft option 106 blinks by reversed field image or intensity change. In FIG. 4, SOFT FUNCTION B is shown selected. Such a change acknowledges that the desired soft function 104 or soft option 106 is active.

Once the initial soft function 104 or soft option 106 is selected, the screen pointer 108 disappears and selected function 104 or option 106 is in reverse field image. The reverse field format of the selected function 104 or option 106 serves as a pointer. Again, to move to an adjacent function 104, a generally lateral force is applied to the probe 10 which causes the reverse field image pointer to move in the desired direction. If there is an option 106 associated with selected function 104, then the reverse field image pointer is defaulted to the first option 106. To exit from the reverse field image pointer mode, a generally longitudinal force is applied to the probe 10 until the reverse field pointer reverts back to normal field image and the screen pointer 108 reappears in the center of the display 102.

To make cursor measurements using the probe 10, as opposed to selection of a function 104 or option 106, a generally lateral force is applied to the probe 10 while the probe tip 12 is engaged with a test surface 72. The lateral force will direct the screen pointer 108 to move towards the REF cursor 110 or the A cursor 112. When the screen pointer 108 is positioned over either the cursor 110 or 112, a generally longitudinal force is applied to the probe 10. The longitudinal force selects and "hooks" one of the cursors 110 or 112 and the screen pointer 108 disappears. The cursor 110 or 112 that is selected blinks and intensifies to indicate a hooked or selected mode. If the user desires to move the hooked cursor 110 or 112 in order to obtain an updated cursory readout 114, a generally lateral force is applied to the probe 10 in the manner previously described; this causes the hooked cursor 110 or 112 to move in the desired direction. Cursory readout 114 is updated as the hooked cursor moves across the display 102. To deposit or release the hooked cursor 110 or 112, a generally longitudinal force is applied to the probe 10 in the same manner as previously described. Release of the generally longitudinal force causes the hooked cursor 110 or 112 to revert to normal intensity and the screen pointer 108 re-appears in the center of the display 102.

When not in a measurement or fine adjustment mode, the screen pointer 108 will "snap" directly to the closest available object handle in the direction of the generally laterally applied force rather than "slide" gradually in the direction of said applied force. While in a measurement, fine adjustment, or hooked mode, the screen pointer 108 will slide gradually in the direction of the applied force.

Still referring to FIG. 4, the test and measurement instrument 100 can be manually adjusted without use of the probe 10. The front panel 116 of the test and measurement instrument 100 includes hardware buttons 118, directional arrow keys 120, or a knob 122 for such manual, non-remote adjustment.

Figure 5:
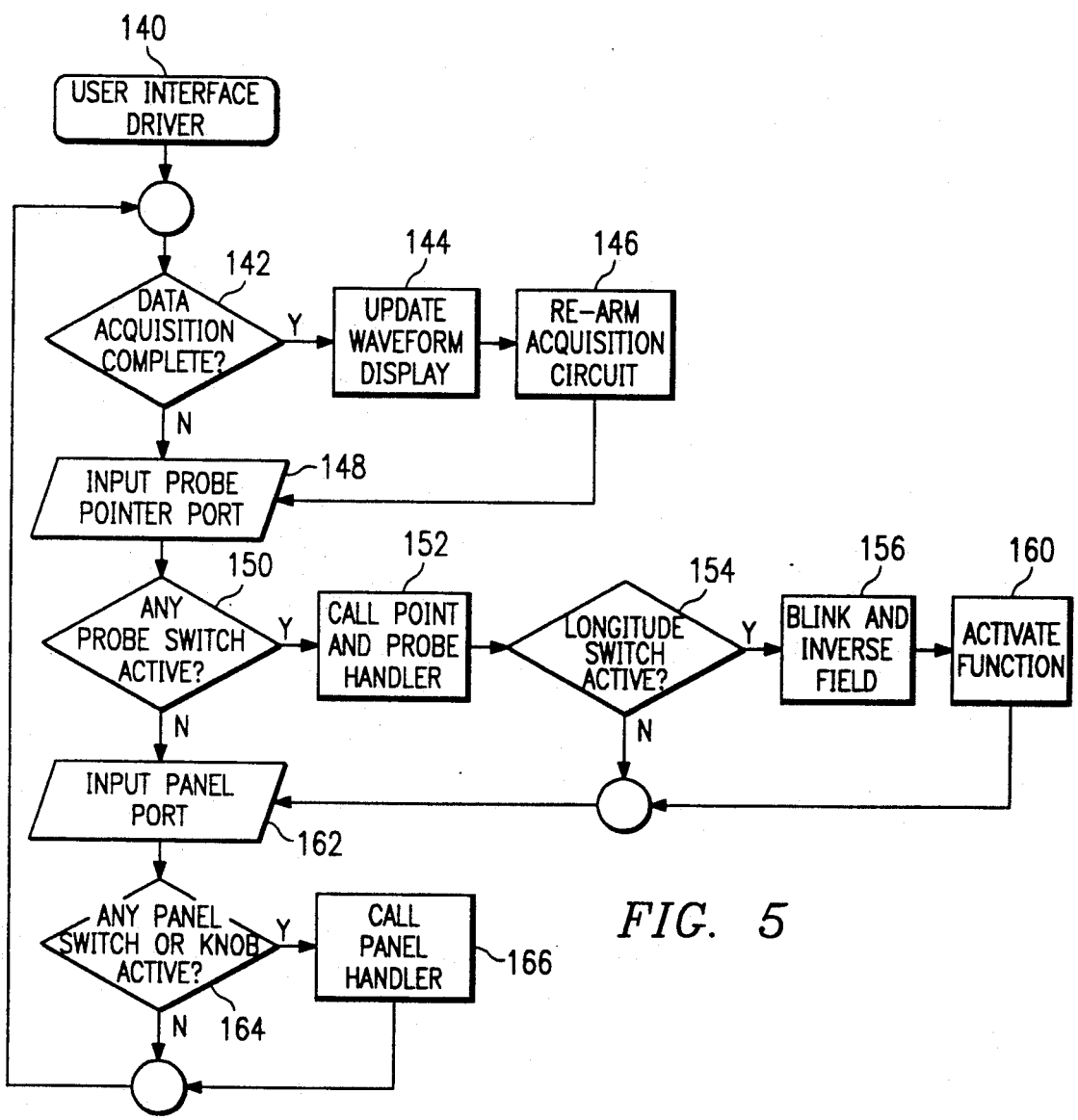
FIG. 5 is a flow chart illustrating the process by which changes to the test and measurement instrumentation are made with the test probe.

Referring now to FIG. 5, there is shown a flow diagram illustrating the process by which the probe 10 can adjust the test and measurement instrument 100 while simultaneously probing. Beginning at block 140, the subroutine or computer program which handles the processes performed by the probe 10 is activated. From the block 140, the program determines whether the user has completed a data acquisition at the block 142. The data acquisition refers to the completion of all samples required for a test to generate an accurate response. Once all samples have been collected the data acquisition memory is full and no further samples can be stored. Thus, at block 142, it is determined if the data acquisition memory is full; if so, the process proceeds to block 144 where the test and measurement instrument 100 updates the waveform shown on the display 102. After updating the waveform, the acquisition circuit is re-armed in block 146. Re-arming of the acquisition circuit permits additional probing or data input into the acquisition memory.

If the data acquisition is not complete at block 142 or if the data acquisition circuit was rearmed in block 146, the process, at block 148 performs the routine designed for the pointer element of the probe 10, i.e., the remote manipulation and adjustment of the test and measurement instrument 100. At block 150, the initial inquiry within the pointing routine asks whether any of the probe switches are active. The probe switches include the −x axis conductive pad 38, the +x axis conductive pad 40, the −y axis conductive pad 42 and the +y axis conductive pad 44 as well as the selection contactor pad 52, all described in FIG. 1. Thus, if any of the switches are active, the routine calls upon the point and probe handler software, at the block 152, to direct the actions of the probe 10, in its point function. If, at the block 154, the longitudinal switch is active, i.e., selection conductor pad 52, then the user has already selected by way of the conductive pads 38, 40, 42 or 44 the function desired. Activating the longitudinal switch at block 154 causes the function 104 or option 106 on the display 102 to blink and inverse field at block 156. The blinking and inverse field at block 156 indicates that the desired function 104 or option 106 is active, which is shown at block 160.

If none of the probe switches are active at the block 150, or the longitudinal switch is not active at block 154 or if the process is completed by the desired function 104 or option 106 being activated at the block 160, the program begins its check to determine if a manipulation of the test and measurement instrument 100 has occurred at the instrument itself. This check begins at the block 162. If a hardwire button 118, directional arrow key 120 or knob 122 residing upon the front panel 116 of the test and measurement instrument, is activated at the block 164, the program initiates the panel routine to perform the proper task. Once the tasks are performed or if no such manipulation occurs locally at the front panel 116, the program returns to the beginning at the block 140 and the process is repeated.

Thus, there has been described and illustrated herein, a method and apparatus for simultaneously probing a circuit while remotely controlling test and measurement instrumentation used for the probing. Those skilled in the art, however, will recognize that many modifications and variations besides those specifically mentioned may be made in the techniques described herein without departing substantially from the concept of the present invention. Accordingly, it should be clearly understood that the form of the invention as described herein is exemplary only and is not intended as a limitation on the scope of the invention.

What is claimed is:

1. A system for simultaneously probing a test point while remotely manipulating the functions of a test instrument, said system comprising:
   a probe having a tip, said probe remotely connected to said test instrument; and
   means for manipulating the functions of said test instrument, said manipulation means housed within said probe, and said manipulation means comprising:
   means for selecting and activating a predetermined one of said functions in response to sequential first and second manual user forces exerted on said probe tip while it is maintained in operative contact with said test point, said first user force being generally transverse to said second user force.

2. The system of claim 1 wherein said probe comprises:
   a tip;
   a signal conductor;
   a characteristic impedance circuit, said circuit disposed between and electrically connected to said tip and said signal conductor;
   a signal conductor sheath, said sheath enveloping said signal conductor;
   a compensation circuit board, said compensation circuit board being electrically connected to said signal conductor;
   means for grounding said probe, said grounding means electrically connected to said compensation circuit board; and
   means for transmitting electrical signals from said compensation circuit board to said test instrument, said transmission means electrically connected to said compensation circuit board.

3. The system of claim 2 wherein said tip is comprised of hardened electrically conductive material.

4. The system of claim 3 wherein said compensation circuit board is adjustable.

5. The system of claim 2 wherein said transmission means comprises a coaxial cable.

6. A system for simultaneously probing a test point while remotely manipulating the functions of a test instrument, said system comprising:
   a probe having a tip, said probe remotely connected to said test instrument; and
   means for manipulating the functions of said test instrument, said manipulation means housed within said probe, and said manipulation means comprising:
   means for detecting lateral forces applied to said probe tip; and
   means for detecting longitudinal forces applied to said probe tip.

7. A system for simultaneously probing a test point while remotely controlling the calibration of such testing comprising:
   a test instrument;
   a probe remotely connected to said test instrument; and means for manipulating the functions of said test instrument, said manipulation means housed within said probe, and said manipulation means comprising:
   means for detecting lateral forces applied to said probe; and
   means for detecting longitudinal forces applied to said probe, said longitudinal force detection means comprising:
   at least one spring;
   at least one conductive pad;
   at least one electrically conductive flange, said flange being forced into contact with said conductive pad by said spring;
   means for transferring longitudinal force exerted upon said probe to said spring such that said spring contracts thereby allowing said conductive pad and said conductive flange to separate, said separation causing an otherwise closed circuit to open; and
   means for detecting said opening of said closed circuit.

8. A method for simultaneously examining a test circuit while remotely adjusting or manipulating the controls of a test instrument, said method comprising the steps of:
   probing a test circuit with an electrical test probe, said test probe having a tip;
   exerting a lateral force upon said probe tip, said lateral force moving a cursor displayed on said test instrument;
   choosing a function on said test instrument;
   releasing said lateral force when said function is chosen; and
   activating said chosen function.

9. The method of claim 8 wherein said step of probing comprises the steps of:
   acquiring data pertaining to the status of a test circuit, said data acquisition performed with said electrical test probe;
   determining if data acquisition is complete;
   updating a waveform displayed by said test instrument when said data acquisition is completed; and
   re-arming a data acquisition circuit, said re-arming permitting additional data acquisition to occur.

10. The method of claim 8 wherein said lateral force exerted upon said probe tip is applied in a specific direction, said direction corresponding to the direction in which said cursor moves on a display of said test instrument.

11. The method of claim 8 wherein said step of activating said chosen function or option comprises the steps of:
- applying a longitudinal force to said probe tip; and
- detecting said longitudinal force.

12. A method for simultaneously examining a test circuit while adjusting or manipulating the controls of a test instrument, said method comprising the steps of:
- probing a test circuit with an electrical test probe;
- exerting a lateral force upon said probe, said lateral force moving a cursor displayed on said test instrument;
- choosing a function on said test instrument;
- releasing said lateral force when said function is chosen, said step of releasing said lateral force when said function or option is chosen causing a transformation in the status of said function or option, said transformation causing said function or option to blink and inverse field; and
- activating said chosen function.

13. A method of testing an electrical circuit having a plurality of test contact points thereon, said method comprising the steps of:
- providing a test instrument having a plurality of test functions which may be individually selected and activated;
- remotely connecting a manually operable electrical probe to said test instrument,
- said electrical probe having a tip portion extending along an axis and having an outer end;
- positioning said tip portion against a selected one of said test contact points while manually grasping said electrical probe;
- manually exerting a force on said tip portion while maintaining it in operative contact with the selected test contact point, said force being generally transverse to said axis; and
- sensing the presence of said force and responsively changing the setting of said instrument from a first test function to a selected second test function.

* * * * *